US007479782B2

(12) United States Patent
Van Den Brink

(10) Patent No.: US 7,479,782 B2
(45) Date of Patent: Jan. 20, 2009

(54) SYSTEM AND METHOD FOR MRI USING MR SIGNALS FROM DIFFERENT RESONANT SPECIES IN DIFFERENT REGIONS OF K-SPACE

(75) Inventor: Johan S. Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 207 days.

(21) Appl. No.: 10/595,273

(22) PCT Filed: Oct. 1, 2004

(86) PCT No.: PCT/IB2004/051942

§ 371 (c)(1),
(2), (4) Date: Apr. 4, 2006

(87) PCT Pub. No.: WO2005/036197

PCT Pub. Date: Apr. 21, 2005

(65) Prior Publication Data

US 2006/0279282 A1 Dec. 14, 2006

(30) Foreign Application Priority Data

Oct. 13, 2003 (EP) ................... 03103770

(51) Int. Cl.
*G01V 3/00* (2006.01)
(52) U.S. Cl. .................... 324/307; 324/309
(58) Field of Classification Search ......... 324/300–322; 600/407–435; 382/128–131
See application file for complete search history.

(56) References Cited

U.S. PATENT DOCUMENTS

| 4,767,991 A | * | 8/1988 | Rzedzian | 324/312 |
|---|---|---|---|---|
| 5,485,086 A | * | 1/1996 | Meyer et al. | 324/307 |
| 5,539,313 A | * | 7/1996 | Meyer | 324/309 |
| 5,604,434 A | * | 2/1997 | Schomberg | 324/309 |
| 6,046,588 A | | 4/2000 | Watanabe | |
| 6,225,804 B1 | * | 5/2001 | Lai | 324/309 |
| 6,373,249 B1 | | 4/2002 | Kwok et al. | |
| 6,400,151 B1 | | 6/2002 | Haase et al. | |
| 6,411,089 B1 | | 6/2002 | Anand et al. | |
| 6,583,623 B1 | | 6/2003 | Kwok et al. | |

(Continued)

FOREIGN PATENT DOCUMENTS

| WO | WO 98/30918 A1 | 7/1998 |
|---|---|---|
| WO | WO 99/14616 A1 | 3/1999 |

*Primary Examiner*—Brij B. Shrivastav
*Assistant Examiner*—Tiffany A Fetzner

(57) ABSTRACT

The invention relates to a system and method for magnetic resonance imaging. In order to achieve high resolution imaging a magnetic resonance imaging system and method is proposed, wherein magnetic resonance signals using a first resonance frequency are used for a central portion of k-space and magnetic resonance signals using a second resonance frequency are used for a peripheral portion of k-space. In a preferred embodiment of the invention non-proton magnetic resonance signals are used for the central portion of the k-space and proton magnetic resonance signals are used for the periphery of k-space. Accordingly, the reconstructed magnetic resonance image shows contrast relating to the non-proton nuclei and fine resolution dominated by the protons. Hence, the invention can especially provide a solution for the limited time available for the acquisition of non-proton magnetic resonance signals.

16 Claims, 2 Drawing Sheets

U.S. PATENT DOCUMENTS

| | | |
|---|---|---|
| 6,593,740 B1 * | 7/2003 | Van Den Brink et al. .... 324/307 |
| 6,995,560 B2 * | 2/2006 | Duerk et al. ................ 324/310 |
| 7,034,533 B2 * | 4/2006 | Mugler et al. ............... 324/318 |
| 7,042,215 B2 * | 5/2006 | Moriguchi et al. .......... 324/307 |
| 7,078,899 B2 * | 7/2006 | Dale et al. .................. 324/314 |
| 2003/0122545 A1 * | 7/2003 | Van Den Brink et al. .... 324/309 |
| 2004/0260173 A1 * | 12/2004 | Salerno et al. .............. 600/420 |
| 2005/0017717 A1 * | 1/2005 | Duerk et al. ................ 324/307 |
| 2005/0033153 A1 * | 2/2005 | Moriguchi et al. .......... 600/410 |
| 2005/0057249 A1 * | 3/2005 | Dale et al. .................. 324/307 |
| 2005/0174114 A1 * | 8/2005 | Mugler, III et al. ......... 324/309 |
| 2006/0279282 A1 * | 12/2006 | Van Den Brink et al. .... 324/309 |

* cited by examiner

SYSTEM AND METHOD FOR MRI USING MR SIGNALS FROM DIFFERENT RESONANT SPECIES IN DIFFERENT REGIONS OF K-SPACE The invention relates to a system and method for magnetic resonance (MR) imaging.

MR imaging technologies using the $^1$H nucleus (proton) are well known in the prior art. During the last years attention has been paid to MR imaging technologies using magnetic resonance signals originating from nuclei other then proton, for example $^{13}$C or $^{31}$P. An important problem in MR imaging of non-proton nuclei is the low signal-to-noise ratio (SNR) for imaging such nuclei. The reasons for the low SNR are among other things the much lower natural abundance of such nuclei compared with protons, their lower gyromagnetic ratio, and the low concentration of enriched substances. To overcome this problem and to achieve a sufficient SNR, the polarization of the nuclei can be enhanced by several methods.

One of these methods is to hyperpolarize these nuclei. However, the first radio frequency (RF) pulse, which is applied to the magnetic field, will reduce the degree of hyperpolarization noticeable, so that the total number of MR signal readouts (echoes) is limited. This limited number of MR echo signals again leads to a limited spatial resolution of the resulting magnetic resonance image. In the past, single shot techniques have been applied to overcome these difficulties.

Another aspect is, that during the acquisition of MR signals the hyperpolarized magnetization decays rapidly. This decay will cause a broadening of the point-spread function, which is the Fourier-transform of the signal decay. This further limits the resolution for imaging with non-proton nuclei.

For non-proton nuclei, the gyromagnetic ratio is less than for proton, e.g. the ratio to proton equals 70% for $^{19}$F and $^3$He, and 25% for $^{13}$C and $^{129}$Xe, respectively. This implies a reduction in the efficiency of the k-space traversal for a given gradient strength. Thus, for a given resolution and a given gradient amplitude, the repetition time must be four times longer for $^{13}$C and $^{129}$Xe. For a typical gradient system parameters, the repetition time for whole object imaging at adequate resolution, e.g. at a resolution of 2 mm, amounts up to 2.5 to 3 ms for protons. For other nuclei, like $^{13}$C, the repetition time will be 10 to 15 ms. That implies that even slow decay of the polarized MR signal is counteracted by the inherent slower readout of the MR signal.

As a consequence of the fact, that there is only a limited time to acquire the MR image for hyperpolarized species, and that the repetition times are relatively long, the resolution of the images is inherently limited. By way of example a 2 mm nominal resolution at a field-of-view (FOV) of 400 mm requires 200 phase-encoding steps, i.e. 2 to 3 seconds readout for a single plane in k-space. To achieve sufficient coverage of an object, multiple slices, or planes in k-space have to be sampled, typically 40 to 100. This results in a readout time of 100 to 300 seconds. In this case the blurring will be so severe, that the 2 mm resolution is not achieved at all. Imaging at higher resolution, e.g. a 0.5 to 1.0 mm resolution, considering 300 to 500 phase-encoding steps required for a single slice and a minimal repetition time of 7 to 10 ms, makes the problem worse.

From the prior art it is known that combined acquisition techniques provide some advantages in obtaining adequate time resolution and/or spatial resolution for MR imaging of aqueous species. Such an acquisition technique is disclosed in U.S. Pat. No. 6,400,151. Therein different sequences of high frequency pulses and magnetic field gradient pulses are used to acquire different sets of MR signals from water protons. These water proton MR signals are combined to form a k-space, whereby different sets are used for different bands of k-space. However, the proposed method does not provide a solution to the limited time available for the acquisition of non-proton MR signals.

It is an object of the present invention to provide a magnetic resonance imaging system and method which enable high resolution imaging for nuclei from species other than water.

This object is achieved according to the invention by a MR imaging system comprising an acquisition module for acquiring first magnetic resonance signals for a central portion of k-space using a first resonance frequency and for acquiring second magnetic resonance signals for a peripheral portion of k-space using a second resonance frequency, a data module for combining first k-space data corresponding to the first magnetic resonance signals and second k-space data corresponding to the second magnetic resonance signals to form a full k-space and an image module for generating an image by transformation of k-space to image space. Thereby the term "full k-space" is to be understood as a k-space having adequate coverage of sample points to reconstruct images at the target resolution.

The object of the present invention is also achieved by a MR imaging method, the method comprising the steps of acquiring first magnetic resonance signals for a central portion of k-space using a first resonance frequency, acquiring second magnetic resonance signals for a peripheral portion of k-space using a second resonance frequency, combining first k-space data corresponding to the first magnetic resonance signals and second k-space data corresponding to the second magnetic resonance signals to form a full k-space and generating an image by transformation of k-space to image space.

According to the invention signals for a central portion of k-space and for a peripheral portion of k-space are acquired separately. Hereby it has been taken into account, that both portions of k-space provide different information, which can advantageously be used during the process of MR imaging. Thereby the fact is used, that the SNR and the contrast characteristics of a MR image is primarily determined by the center of k-space, whereas the periphery of k-space provides information with regard to the fine resolution of the MR image. In order to provide an enhanced MR image the present invention suggests to operate with different MR resonance frequencies. The MR apparatus used with the present invention is therefore adapted to operate at two or more different MR resonance frequencies.

These and other aspects of the invention will be further elaborated on the basis of the following embodiments which are defined in the dependent claims.

In a preferred embodiment of the invention this includes multi-nuclear imaging, e.g. using protons and non-proton nuclei, such as $^1$H and $^{13}$C. Thereby hyperpolarized non-proton species are preferably used and the modules for acquiring first magnetic resonance signals are adapted accordingly, e.g. for hyperpolarized $^{13}$C. Other species, e.g. not hyperpolarized non-proton nuclei, can be used as well. For example $^{31}$P imaging may be carried out without additional polarization.

In this implementation of the invention the magnetic resonance signals of the non-proton nuclei are acquired for a central portion of k-space, notably for the center of the k-space. For a peripheral portion of k-space proton magnetic resonance signals are acquired, specifically from $^1$H in $H_2O$. That is, the central part of k-space is covered with the data from the species with the non-proton nucleus, whereas the outer part of k-space is covered with proton data. The proton data can be acquired before or after the acquisition of the non-proton data. In a preferred embodiment of the invention a MR signal generating nucleus, other than proton, is administered to the object. In case, the scanned object is sensitive to administering the contrast agent containing a chemical species with the other nucleus it may be advantageous to first acquire all relevant proton data, e.g. by carrying out a quick water scan.

The magnetic resonance image is than reconstructed from the non-proton MR signals from the central portion of the k-space and the proton MR signals from the periphery of k-space. Accordingly, the reconstructed MR image shows contrast distribution determined by the non-proton nuclei whose resolution is enhanced by the water proton signals. That is, the image contains a high-resolution non-proton contrast distribution.

Preferably, proton MR data for the peripheral portion of k-space, e.g. data from $^1H$ in $H_2O$, are acquired at a high resolution. Thereby a preferred resolution in a range of 1 to 2 mm is achieved. MR data for the other nucleus, e.g. $^{13}C$, or for $^1H$ in another environment are acquired at lower resolution, typically 4 to 5 mm. As the extent of k-space is inversely proportional to resolution with a given gyromagnetic ratio, typical values for the proportioning factor between the central portion of k-space and the peripheral portion are 20 to 25% for the central part in one direction.

The signal acquisition for a central portion of k-space does only require a short acquisition time. Hence, this method can provide a solution for the limited time available for the acquisition of non-proton MR signals. Because of the short acquisition time rapid decay of the excitation of the non-proton nuclei does neither limit the SNR, nor the effective point spread function, of the reconstructed, combined image. The reconstructed MR image shows contrast relating to the non-proton nuclei and fine resolution dominated by protons.

With the combined acquisition technique for multi-nuclear imaging according to the invention the resolution limits inherent to imaging hyperpolarized non-proton magnetization can be overcome by extending the non-proton k-space by combining non-proton and proton MR signals.

Generally the present invention is applicable for any spin carrying substance detected with an MR method. Free radicals carry an electron spin, which has a very high sensitivity compared with protons. This implies that with electron spin resonance (ESR) much lower concentrations can be detected. In order to realize high resolution imaging with ESR in lossy samples such as the human body, problems related to the line-width of electron spin signals has to be overcome. In another preferred embodiment of the invention it is suggested that the first magnetic resonance signals are acquired from electron spins. Hereby the central k-space is filled with ESR signals to determine the overall contrast distribution, while resolution is enhanced e.g. with water proton signals covering the outer parts of k-space.

In yet another preferred embodiment of the invention MR data originating solely from nuclei of the same kind, such as only protons, is used. Such a system can be used e.g. for $^1H$ CSI (proton chemical shift imaging). In this embodiment first MR data are acquired e.g. from $^1H$ in creatine, lactate or choline etc., featuring substantially different Larmor frequencies than water protons, whereas second MR data are acquired e.g. from $^1H$ in $H_2O$. Therefore the method according to the invention can also be applied to enhance the resolution of $^1H$ spectroscopic images e.g. of metabolites. Besides the fact, that this embodiment uses protons only, all above mentioned features of method and apparatus are applicable accordingly.

Combination of k-space data in order to form a full k-space is achieved preferably by combining the data of a first plurality of k-space lines corresponding to the first MR signals and the data of a second plurality of k-space lines corresponding to the second MR signals. Thereby in a preferred embodiment of the invention the first k-space data is substituted for part of the second k-space data to form a full k-space. In this case a complete image originating from the second MR signals can be reconstructed an (re)viewed, which may contain additional relevant contrast or structural information. In another embodiment of the invention the first k-space data is added to or incorporated into the second k-space data to form a full k-space. By leaving out central k-space the time needed for data acquisition can be reduced by 20 to 25%.

In a further embodiment of the invention the data for outer k-space is selectable e.g. out of a set of different water images. This can be done manually by the user of the MR imaging system or even automatically by an analysis of corresponding parameters. By this measure the most appropriate data set can be selected according to the target result.

According to the invention the final magnetic resonance image is formed on the basis of first and second MR signals based on an acquisition of data using at least two different resonance frequencies. In other words, the final MR image is formed from a combined data set of MR echoes originating either from at least two nuclei with different gyromagnetic ratios, or from identical nuclei, e.g. protons, which experience a different environment and thus show a chemical shift which leads to a frequency offset. That is, the MR apparatus is capable of operation at two resonance frequencies, accommodated either to proton and the special nucleus or to protons in different environments. The acquisition strategies used in the present invention are different for the central and the peripheral or outer part of k-space in that different MR frequencies are used to match the resonance frequencies for the different nuclei or for same nuclei in different environments.

The according devices for acquiring magnetic resonance signals (MR apparatus) include inter alia coils for creation of gradient magnetic fields, current supply devices, high frequency generators, control devices, RF signal antennae, readout devices etc.

All appliances are adapted to carry out the method according to the present invention. In particular, the MR apparatus is adapted to accompany changes of the gyromagnetic ratio with according gradient amplitude changes and to provide adequate gradient power to attain an adequate resolution in a short enough time. All apparatus modules, e.g. the control device for measuring time, frequency and amplitude parameters for the RF pulses, the gradients and the echo readout, are constructed and programmed in a way that the procedures for obtaining data and for data processing run in accordance with the method of the invention.

The steps of combining data and generating images are preferably carried out in a computer connected with the MR apparatus. Preferably the computer is an integral component of the MR imaging system. The computer includes inter alia a central processor unit (CPU), a bus system, memory means, e.g. RAM or ROM, storage means, e.g. floppy disk or hard disk units and input/output units. The acquired raw MR data originating from the MR scanning are transferred to the computer and stored therein in order to combine the data to composite a full k-space prior to image reconstruction.

The object of the present invention is also achieved by a computer program comprising computer instructions adapted to perform the MR imaging method according to the invention when the computer program is executed in a computer of a MR imaging system. The technical effects necessary to produce magnetic resonance images in accordance with the invention can thus be realized on the basis of the instructions of the computer program in accordance with the invention. Such a computer program can be stored on a carrier such as a CD-ROM or it can be available over the internet or another computer network. Prior to executing the computer program is loaded into the computer by reading the computer program from the carrier, for example by means of a CD-ROM player, or from the internet, and storing it in the memory of the computer.

These and other aspects of the invention will be described in detail hereinafter, by way of example, with reference to the following embodiments and the accompanying drawings; in which.

Figure 1:
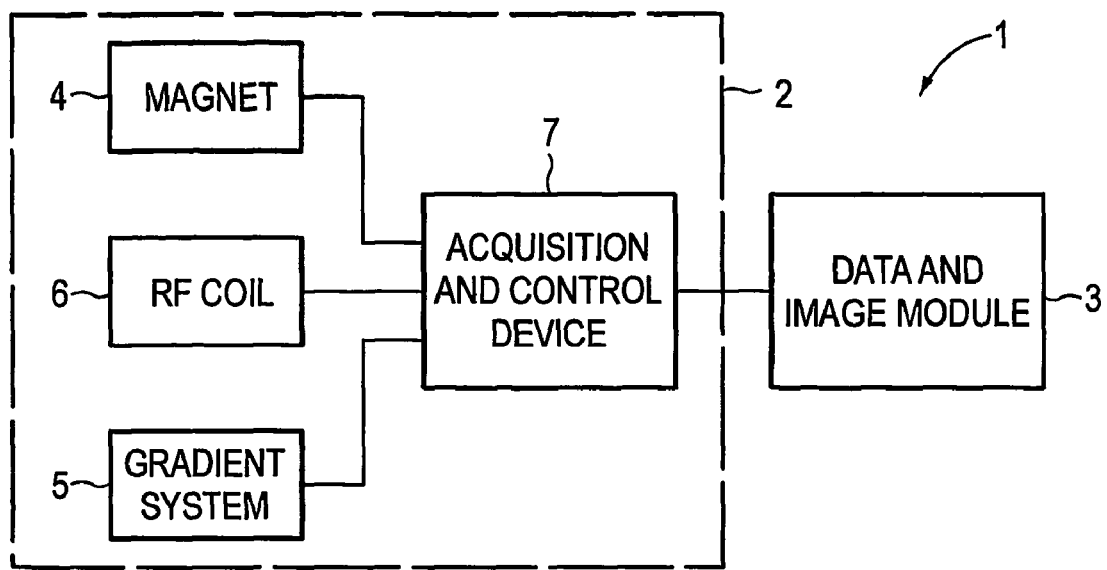
FIG. 1 is a block diagram showing an overview of a system on which the preferred embodiment can be implemented.

A typical MR imaging system 1 on which the preferred embodiment can be implemented is shown in a simplified block diagram of FIG. 1. The imaging system 1 basically comprises an acquisition module 2 and a combined data and image module 3.

The acquisition module 2 comprises a magnet 4 for generating the static magnetic field, a magnetic field gradient system 5, consisting of gradient amplifier and gradient coils for spatial selection and spatial encoding. Furthermore the imaging system 1 comprises RF amplifier and RF transmit coil for production of measurement pulses to excite the nuclei and RF receive coil and amplifier to detect the re-emitted signal from the nuclei. Transmit coil and receiver coil are electronically and physically integrated into RF coil 6. These components are connected to an acquisition and control device 7 for data acquisition control. The acquisition and control device 7 comprises a computer system and computer programs adapted to run on this computer system. These computer programs are adapted to control the process of data acquisition. For example a pulse sequence program is used to control the sequence of measurement pulses applied to excite the nuclei. For acquiring data for peripheral and central parts of k-space the acquisition and control device 7 is adapted to select parts of the MR spectrum, e.g. by using filters. These filter techniques are also controlled by a special computer program. Other techniques known per se, such as the use of broadband decoupling for reducing the width of the NMR spectrum for a certain nucleus, simplifying the spectra and concentrating the signal intensity into fewer spectral lines, may be applied. With such a decoupling technique for example the spin-spin-coupling to protons can be effectively removed.

Furthermore the acquisition module 2 includes an archiving system for storing and archiving raw k-space data and image data and an operating and viewing console for display of the images and for operator input of control parameters.

The combined data and image module 3 which is connected to the acquisition module 2 is used for digital signal processing and image processing. The data and image module 3 comprises a computer system and computer programs to run on this computer system. These computer programs are adapted inter alia for carrying out the digital signal processing and the image processing step according to the invention.

Figure 2:
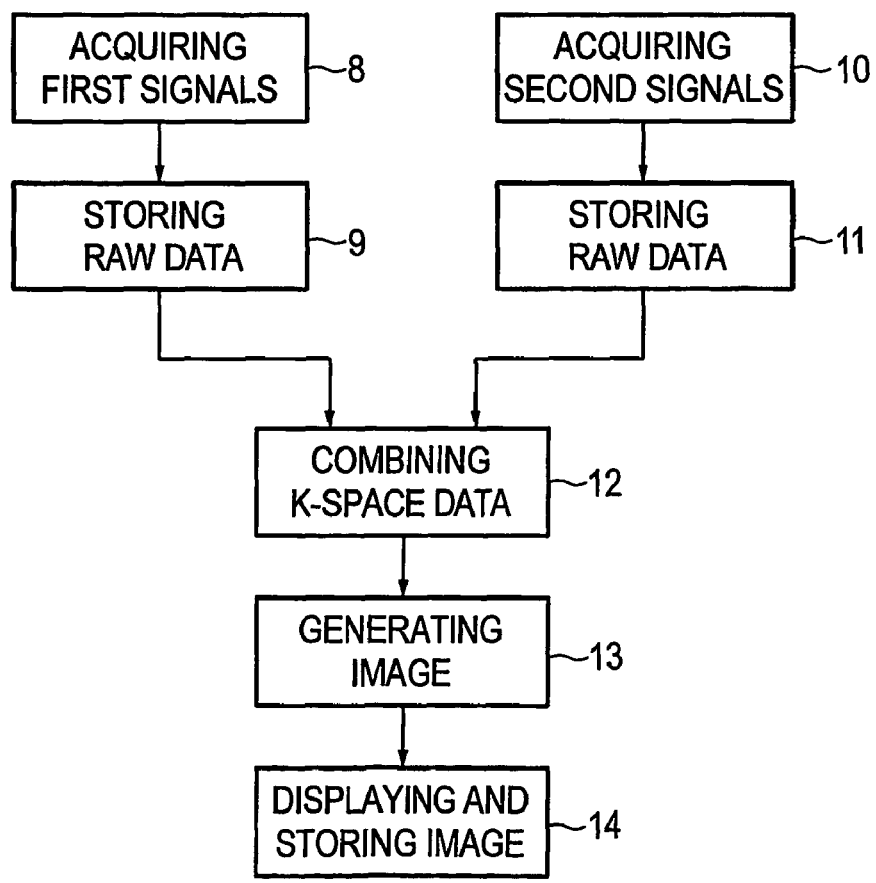
FIG. 2 is a flow chart showing the steps for carrying out the method according to the invention.

The steps necessary to carry out the magnetic resonance imaging method according to the invention are illustrated in a simplified flow chart in FIG. 2.

In the illustrated embodiment a multi-nuclear imaging technique is applied, using protons $^1H$ and hyperpolarized non-proton nuclei $^{13}C$. The method comprises the first step 8 of acquiring first magnetic resonance signals for a central portion of k-space using the $^{13}C$ resonance frequency at a resolution of 4 mm. In case of low signal amplitudes, multiple averages may be taken for central k-space. Following acquisition the raw MR responses are stored in a computer memory and transferred to the data and image module 3 for further processing in the next step 9.

In a further step 10 second magnetic resonance signals are acquired for a peripheral portion of k-space by an $H_2O$ scan using the $^1H$ resonance frequency at a resolution of 1 mm. The $^1H$ data are acquired after the acquisition of the $^{13}C$ data. In the simplest case, the FOV of the $^1H$ and $^{13}C$ acquisition are equal, as well as the inter-sample distances in k-space, i.e. the gradient strengths are adjusted to accommodate for the different gyromagnetic ratios. However, this is not essential. Again the resulting raw data are stored and transferred in the following step 11 to the data and image module 3. Since data for several parts of k-space are obtained, the method comprises carrying out an indexing technique to relate inner and outer k-space data.

Following these acquisition steps 8, 10 a full k-space is formed in step 12, where the inner or central part of k-space is covered with the $^{13}C$ data and the outer or peripheral part of k-space is covered with $^1H$ data. This combining step 12 is carried out by a computer system, which is part of the data and image module 3. In a simple case an according computer program adds the $^{13}C$ data to the $^1H$ data. Discontinuities in k-space may occur during this composition process, but are known to have only a limited detrimental effect. However, in a preferred embodiment correction schemes, such as gridding or iterative reconstruction using conjugate gradient techniques, are applied accordingly.

In case where k-space density varies for inner and outer k-space, k-space filtering may be applied to match the different densities. For this purpose different filtering techniques are known from the prior art.

After a full k-space has been formed an image is generated in a next step 13 by transformation of k-space to image space. The image is created by applying an image formation algorithm, generally a Fourier transform, to the composite k-space. For generating the image a computer system is applied, which is preferably part of the data and image module 3 and which uses according computer software for applying the Fourier algorithm. Since the image formed is based on the k-space data acquired by the described multi-nuclear scanning technique, the reconstructed image now shows a contrast distribution relating to the $^{13}C$ data and fine resolution dominated by $^1H$ data. After image generating the image is displayed in the viewing console and finally stored in an image archive in step 14.

Figure 3:
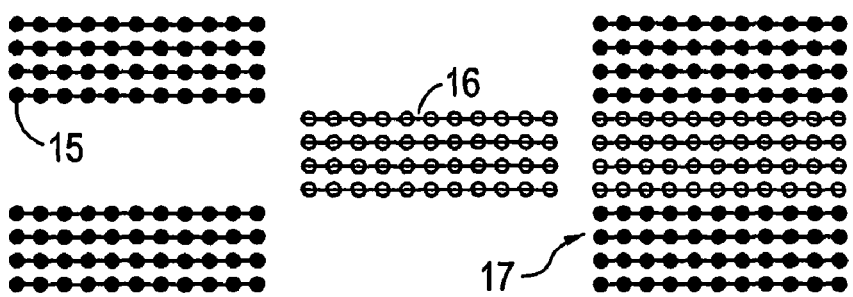
FIG. 3 is a schematic showing k-space data according to a first embodiment of the invention.

In the above described first embodiment of the invention an equal FOV for $^1H$ and $^{13}C$ is used. Furthermore the size of a k-space step in each dimension (readout, first and second phase-encode direction) is equal. In this configuration the required gradient areas for $^1H$ and $^{13}C$ have to scale with the gyromagnetic ratio. The pulse program for the composite data acquisition is adapted accordingly. In other words, the pulse program takes this ratio into account in prescribing the pulse sequence. This will cause the digitized MR data points for both nuclei to form a correct rectangular grid that can be subjected to the fast Fourier transform algorithm without further processing. This is visualized in FIG. 3, where the horizontal axis is to be understood as $k_x$ and the vertical axis as $k_y$. K-space data points 15 resulting from data acquisition using the $^1$H resonance frequency are shown on the left hand side. K-space data points 16 resulting from data acquisition using the $^{13}$C resonance frequency are shown in the middle. On the right hand side a full k-space 17 is shown, reconstructed by adding the first k-space data to the second k-space data. Extension to 3D k-spaces is straightforward.

Figure 4:
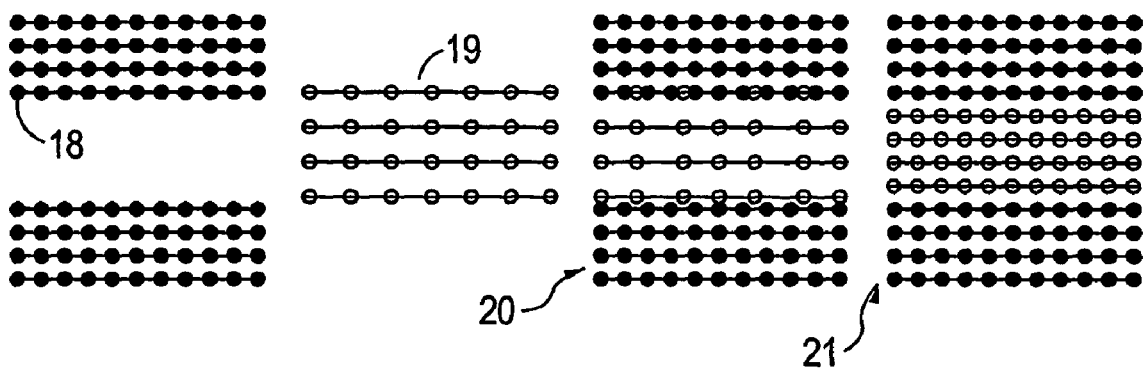
FIG. 4 is a schematic showing k-space data according to a second embodiment of the invention.

In a second embodiment of the invention a more advanced case is described. Therein the distance in k-space is different for the different nuclei. Such discontinuities in k-space are corrected for by a gridding approach. The sequence program provides the reconstruction program with the information on the positions of the digitized MR echo signals. The reconstruction program then fits the results onto a rectangular grid. In FIG. 4 k-space data points 18 resulting from data acquisition using the second resonance frequency and k-space data points 19 resulting from data acquisition using the first resonance frequency are shown on the left hand side. A full k-space 20 with different distances and a full gridded k-space 21 are shown on the right hand side.

Figure 5:
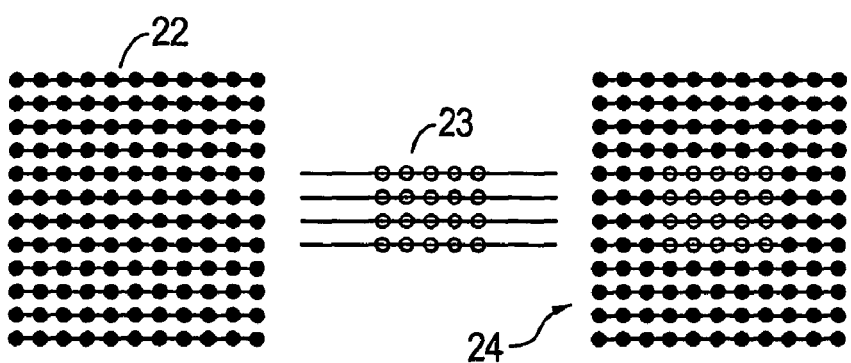
FIG. 5 is a schematic showing k-space data according to a third embodiment of the invention.

In a third embodiment the central k-space is acquired as a square with no readout, but both directions being phase encoded like for chemical shift imaging (CSI). This leads to the situation depicted in FIG. 5, assuming equi-distant k-space discretization. K-space data points 22 resulting from data acquisition using the second resonance frequency are shown on the left hand side. K-space data points 23 resulting from data acquisition using the first resonance frequency are shown in the middle. On the right hand side a full k-space 24 is shown. This full k-space 24 has been reconstructed by substituting the first k-space data for part of the second k-space data. In other words, the data for the second resonance frequency is a complete data set, whereas the data for first resonance frequency, forming the center of k-space, is being added to replace data points acquired at the second resonance frequency.

It will be evident to those skilled in the art that the invention is not limited to the details of the foregoing illustrative embodiments, and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. It will furthermore be evident that the word "comprising" does not exclude other elements or steps, that the words "a" or "an" does not exclude a plurality, and that a single element, such as a computer system or another unit may fulfil the functions of several means recited in the claims. Any reference signs in the claims shall not be construed as limiting the claim concerned.

The invention claimed is:

1. A magnetic resonance imaging system comprising:
   an acquisition module configured for acquiring first magnetic resonance signals in a central portion of k space from a first nuclear or electron species using a first magnetic resonance frequency and configure for acquiring second magnetic resonance signals in a peripheral portion of k space from a second nuclear or electron species different from the first nuclear or electron species using a second magnetic resonance frequency different from the first magnetic resonance frequency;
   a data module configured for combining first k-space data corresponding to the first magnetic resonance signals and second k-space data corresponding to the second magnetic resonance signals in order to form a full k-space; and
   an image module configured for generating an image by transformation of the full k space into image space.

2. The system as claimed in claim 1, wherein the data module for combining first and second k-space data are configured to substitute the first k-space data for part of the second k-space data to form a full k-space.

3. The system as claimed in claim 1, wherein the data module for combining first and second k-space data are configured to add the first k-space data to the second k-space data to form a full k-space.

4. The system as claimed in claim 1, wherein the acquisition module for acquiring first magnetic resonance signals are configured to acquire signals from protons.

5. The system as claimed in claim 4, wherein the acquisition module for acquiring first magnetic resonance signals are configured to acquire signals from protons in another substance than $H_2O$.

6. The system as claimed in claim 1, wherein the acquisition module for acquiring first magnetic resonance signals are configured to acquire signals from non-proton nuclei.

7. The system as claimed in claim 6, wherein the acquisition module for acquiring first magnetic resonance signals are configured to acquire signals from hyperpolarized non-proton nuclei.

8. The system as claimed in claim 1, wherein the acquisition module for acquiring first magnetic resonance signals are configured to acquire signals from electron spins.

9. The system as claimed in claim 1, wherein the acquisition module for acquiring second magnetic resonance signals are configured to acquire signals from protons.

10. The system as claimed in claim 9, wherein the acquisition module for acquiring second magnetic resonance signals are configured to acquire signals from protons in $H_2O$.

11. The system as claimed in claim 1, wherein the acquisition module is configured to acquire the first magnetic resonance signals from a first nuclear species other than the 1H nuclear species and to acquire the second magnetic resonance signals from the 1H nuclear species.

12. The system as claimed in claim 1, wherein the acquisition module is configured to acquire the first magnetic resonance signals from electron spins and to acquire the second magnetic resonance signals from the 1H nuclear species.

13. A carrier or memory storing a computer program executable by a computer to perform a method comprising:
   acquiring first magnetic resonance signals for a central portion of k-space from a first nuclear or electron species using a first magnetic resonance frequency;
   acquiring second magnetic resonance signals for a peripheral portion of k-space from a second nuclear or electron species different from the first nuclear or electron species using a second magnetic resonance frequency different from the first magnetic resonance frequency;
   combining the first k-space data corresponding to the first magnetic resonance signals and the second k-space data corresponding to the second magnetic resonance signals to form a full k-space; and
   generating an image by transformation of the full k-space to image space.

14. A magnetic resonance imaging method comprising:
acquiring first magnetic resonance signals for a central portion of k space from a first nuclear or electron species using a first magnetic resonance frequency;
acquiring second magnetic resonance signals for a peripheral portion of k-space from a second nuclear or electron species different from the first nuclear or electron species using a second magnetic resonance frequency different from the first magnetic resonance frequency;
combining the first k-space data corresponding to the first magnetic resonance signals and the second k-space data corresponding to the second magnetic resonance signals to form a full k-space; and
generating an image by transformation of the full k-space to image space.

15. The magnetic resonance imaging method as claimed in claim 14, wherein the first magnetic resonance signals are from a nuclear species other than the 1H nuclear species, and the second magnetic resonance signals are from the 1H nuclear species.

16. The magnetic resonance imaging method as claimed in claim 14, wherein the first magnetic resonance signals are from electron spins and the second magnetic resonance signals are from the 1H nuclear species.

* * * * *